United States Patent
Jahene et al.

(10) Patent No.: US 7,039,380 B2
(45) Date of Patent: May 2, 2006

(54) AUTOMATIC CENTER FREQUENCY TUNING OF A VOLTAGE CONTROLLED OSCILLATOR

(75) Inventors: Rolf Jahene, Ottendorf-Okrilla (DE); Wolfram Kluge, Dresden (DE); Henry Drescher, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 453 days.

(21) Appl. No.: 10/361,066

(22) Filed: Feb. 7, 2003

(65) Prior Publication Data
US 2004/0087293 A1    May 6, 2004

(30) Foreign Application Priority Data
Nov. 4, 2002    (DE) ............................... 102 51 315

(51) Int. Cl.
  *H04B 1/06* (2006.01)
  *H04B 7/00* (2006.01)

(52) U.S. Cl. ..................... 455/260; 455/255; 327/156; 375/374; 375/375; 375/376

(58) Field of Classification Search ............... 455/255, 455/260, 264, 265; 331/1 A, 11, 14, 17, 331/18, 25; 327/141, 155, 156, 157, 158, 327/159; 375/357, 373, 374, 375, 376
See application file for complete search history.

(56) References Cited

U.S. PATENT DOCUMENTS

| 4,151,485 A * | 4/1979 | LaFratta ..................... 331/1 A |
| 4,280,104 A * | 7/1981 | Rzeszewski ................ 331/1 A |
| 6,121,844 A * | 9/2000 | Suzuki ........................ 331/17 |
| 2002/0180498 A1 * | 12/2002 | O'Leary et al. ............ 327/156 |

FOREIGN PATENT DOCUMENTS
DE    10056294    5/2002

* cited by examiner

*Primary Examiner*—Quochien B. Vuong
(74) *Attorney, Agent, or Firm*—Meyertons Hood Kivlin Kowert & Goetzel, PC; B. Noël Kivlin

(57) ABSTRACT

A frequency synthesizer usable in a wireless communication device is disclosed that may ensure a low phase noise and an improved performance. The frequency synthesizer has a phase locked loop comprising a controllable oscillator generating an output signal with an output frequency that can be adjusted within a predefined frequency range dependent on the value of a first control signal. A phase/frequency detector generates an error signal in response to a phase and/or frequency difference between an input signal generated by frequency dividing said output signal, and a reference signal. A loop filter generates the first control signal based on said error signal and outputs same to the controllable oscillator. A control unit generates a second control signal from the loop filter signal and provides the second control signal to the controllable oscillator, which is arranged for modifying the predefined frequency range based on the second control signal.

21 Claims, 4 Drawing Sheets

AUTOMATIC CENTER FREQUENCY TUNING OF A VOLTAGE CONTROLLED OSCILLATOR

BACKGROUND OF THE INVENTION

1. Field of the Invention

The present invention relates generally to the synthesis of high frequency signals. More particularly, the present invention relates to the synthesis of high frequency local oscillator signals for wireless communication applications.

2. Description of the Related Art

Wireless communication systems typically require frequency synthesis in both the received path circuitry and the transmit path circuitry. Phase locked loop (PLL) circuits including voltage control oscillators (VCO) are of use in mobile unit applications to produce a desired output frequency $f_{out}$. As depicted in FIG. 1, a typical PLL circuitry 100 uses a phase/frequency detector 102 for detecting a frequency and/or phase difference between a reference frequency $f_{ref}$ and the divided output frequency to drive a charge pump 104. This charge pump 104 delivers packets of charge proportional to the phase difference and/or frequency difference to a loop filter 106. The loop filter 106 outputs a voltage that is connected to the VCO 108 to control its output frequency $f_{out}$. The action of this feedback loop attempts to drive the phase difference and/or frequency difference to 0 (or at least to a constant value) to provide a stable output frequency $f_{out}$.

However, the performance of the communication system is critically dependent on the purity of the synthesized high frequency output signals. For signal reception, impure frequency sources result in mixing of undesired channels into the desired channel signal. For signal transmission, impure frequency sources create interference in neighboring channels. Therefore, a frequency synthesizer must typically meet very stringent requirements for spectral purity. The level of spectral purity required in cellular telephone applications make the design of a PLL synthesizer solution and in particular, the design of a VCO within a PLL synthesizer solution quite demanding.

Three types of spectral impurity will typically occur in VCO circuits that are used in PLL implementations for frequency synthesis: harmonic distortion terms associated with output frequency, spurious tones near the output frequency and phase noise centered on the output frequency.

Generally, harmonic distortion terms are not too troublesome because they occur far from the desired fundamental and their effects may be eliminated in cellular phone circuitry external to the frequency synthesizer. Spurious tones, however, often fall close to the fundamental. Phase noise is undesired energy spread continuously in the vicinity of the output frequency, invariably possessing a higher power density at frequencies closer to the fundamental of the output frequency. Phase noise is often the most damaging of the three to the spectral purity of the output frequency.

In PLL based frequency synthesis circuits, the steepness of the VCO frequency control characteristic determines the overall phase noise of the PLL. In order to provide a low VCO phase noise, the steepness should be as low as possible. However, as depicted in FIG. 2, a VCO frequency control characteristic 204 with a lower steepness can provide only a smaller frequency range 208 than a VCO frequency control characteristic 202 having a greater steepness. The minimal VCO steepness is determined by a summation of the frequency span of the VCO and the drift and the tolerance of the device parameters.

SUMMARY OF THE INVENTION

A frequency synthesizer is disclosed that is usable in a wireless communication device and has a phase locked loop, which may reduce phase noise and other signal disturbances and which may provide a radio communication architecture having low complexity and high performance.

In one embodiment, a frequency synthesizer usable in a wireless communication device is provided wherein the frequency synthesizer has a phase locked loop, which comprises a controllable oscillator operable to generate an output signal having an output frequency, the controllable oscillator being arranged for adjusting the output frequency within a predefined frequency range dependent on the value of a first control signal. The phase locked loop further comprises a phase/frequency detector operable to generate an error signal in response to a phase and/or frequency difference between an input signal generated by frequency dividing said output signal and a reference signal. A loop filter connected to generate this first control signal based on the error signal outputs the generated signal to the controllable oscillator. A control unit is provided, which is connected to the loop filter to receive a loop filter signal and generates a second control signal therefrom. The control unit is further connected to the controllable oscillator to provide the second control signal to the controllable oscillator. The controllable oscillator is arranged for modifying the predefined frequency range based on the second control signal.

In another embodiment, a method for operating a frequency synthesizer usable in a wireless communication device and having a phase locked loop with a controllable oscillator is provided that comprises determining a phase and/or frequency difference between an input signal generated by frequency dividing an output signal of the controllable oscillator and a reference signal. The method further comprises generating a control signal for adjusting an output frequency of the controllable oscillator within a predefined frequency range dependent on the value of the control signal. The method further comprises determining whether the control signal exceeds at least one predetermined threshold and tuning the controllable oscillator to a different frequency range, when the control signals exceeds or falls below the at least one predetermined threshold.

In a further preferred embodiment, a WLAN (wireless local area network) receiver is provided, which has a frequency synthesizer with a phase locked loop comprising a controllable oscillator operable to generate an output signal having an output frequency. The controllable oscillator is arranged for adjusting the output frequency within a predefined frequency range dependent on the value of a first control signal. The phase locked loop further comprises a phase/frequency detector operable to generate an error signal in response to a phase and/or frequency difference between an input signal generated by frequency dividing the output signal and reference signal. A loop filter connected to generate said first control signal based on said error signal outputs the generated signal to the controllable oscillator. A control unit connected to the loop filter to receive a loop filter signal generates a second control signal therefrom and is further connected to the controllable oscillator to provide the second control signal to the controllable oscillator. The controllable oscillator is arranged for modifying the predefined frequency range based on the second control signal.

In a further embodiment, a data communication device may be provided that has a frequency synthesizer with a phase locked loop comprising a controllable oscillator operable to generate an output signal having an output frequency.

The controllable oscillator is arranged for adjusting the output frequency within a predefined frequency range dependent on the value of a first control signal. A phase/frequency detector is operable to generate an error signal in response to a phase and/or frequency difference between an input signal generated by frequency dividing the output signal and a reference signal. A loop filter is connected to generate the first control signal based on the error signal and outputs the generated signal to the controllable oscillator. A control unit connected to the loop filter to receiver a loop filter signal generates a second control signal therefrom and are further connected to the controllable oscillator to provide the second control signal to the controllable oscillator. The controllable oscillator is arranged for modifying the predefined frequency range based on the second control signal.

In still another embodiment, an integrated circuit chip having a phase locked loop circuit may be provided. The phase locked loop circuit comprises a controllable oscillator unit operable to generate an output signal having an output frequency. The controllable oscillator unit is arranged for adjusting the output frequency within a predefined frequency range dependent on the value of a first control signal. A phase/frequency detector unit is operable to generate an error signal in response to a phase and/or frequency difference between an input signal generated by frequency dividing the output signal and a reference signal. A loop filter unit connected to generate the first control signal based on the error signal outputs the generated signal to the controllable oscillator unit. The phase locked loop circuit further comprises a control unit connected to the loop filter unit to receive loop filter signal and to generate a second control signal therefrom. The control unit is further connected to the controllable oscillator unit to provide the second control signal to the controllable oscillator unit. The controllable unit is arranged for modifying the predefined frequency range based on the second control signal.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention as illustrated in the accompanying drawings, wherein.

DETAILED DESCRIPTION OF THE INVENTION

The illustrated embodiments of the present invention will be described with reference to the figure drawings, wherein like elements and structures are indicated by a like reference numbers.

Figure 1:
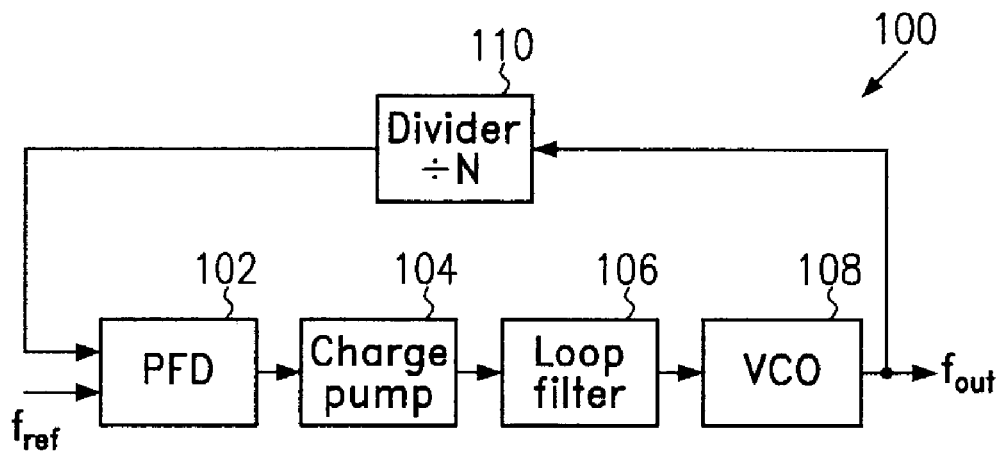
FIG. 1 is a schematic diagram illustrating the phase locked loop technique.
Figure 2:
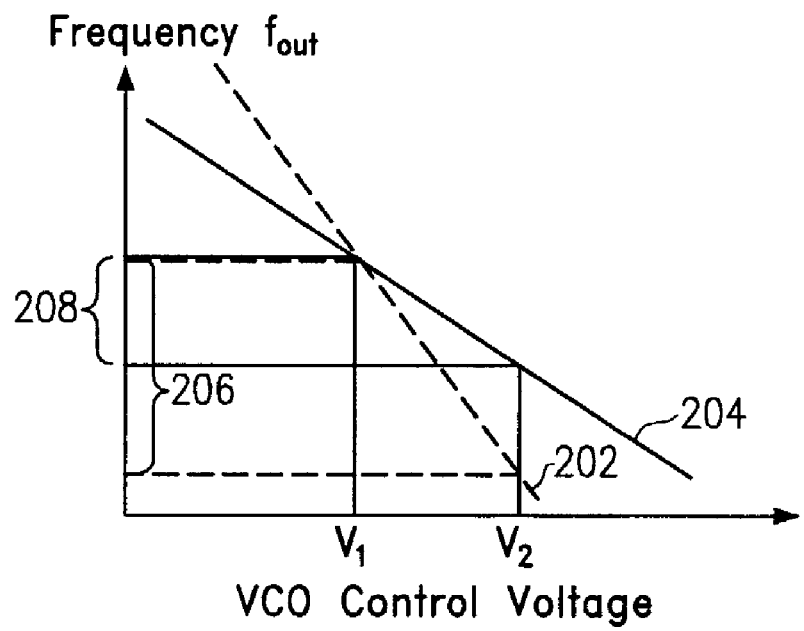
FIG. 2 is a diagram showing the output frequency as a function of the VCO control voltage.
Figure 3:
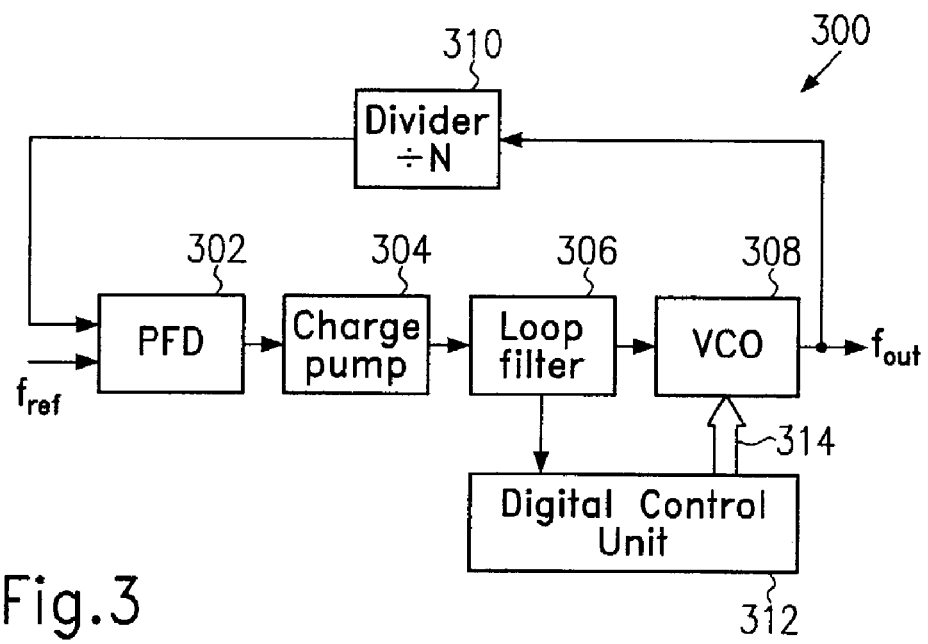
FIG. 3 is a block diagram illustrating a frequency synthesizer according to one embodiment.

Referring now to the drawings and in particular to FIG. 3, which is a block diagram of a frequency synthesizer usable in a wireless communication device according to one embodiment, the frequency synthesizer has a phase locked loop 300 comprising a voltage control oscillator 308 for generating an output signal having an output frequency $f_{out}$. The output signal is frequency divided by means of a divider 310, which may be an integer N divider. This frequency divided signal is compared to a reference signal having a reference frequency $f_{ref}$ by means of a phase/frequency detector 302. The phase/frequency detector 302 outputs an error signal, which may be a charge up or charge down and is input to a charge pump 304. The charge pump 304 converts the charge up and charge down signals into a control voltage for the voltage controlled oscillator 308. A digital control unit 312 receives a loop filter signal and therefrom generates a second control signal 314, which can be input into digital tuning inputs of the VCO 308. Thus, a different frequency range of the voltage controlled oscillator 308 can be chosen. By such an automatic digital center frequency tuning, it is possible to maintain a low steepness of the VCO frequency control characteristics and at the same time, provide a large frequency range.

Figure 4:
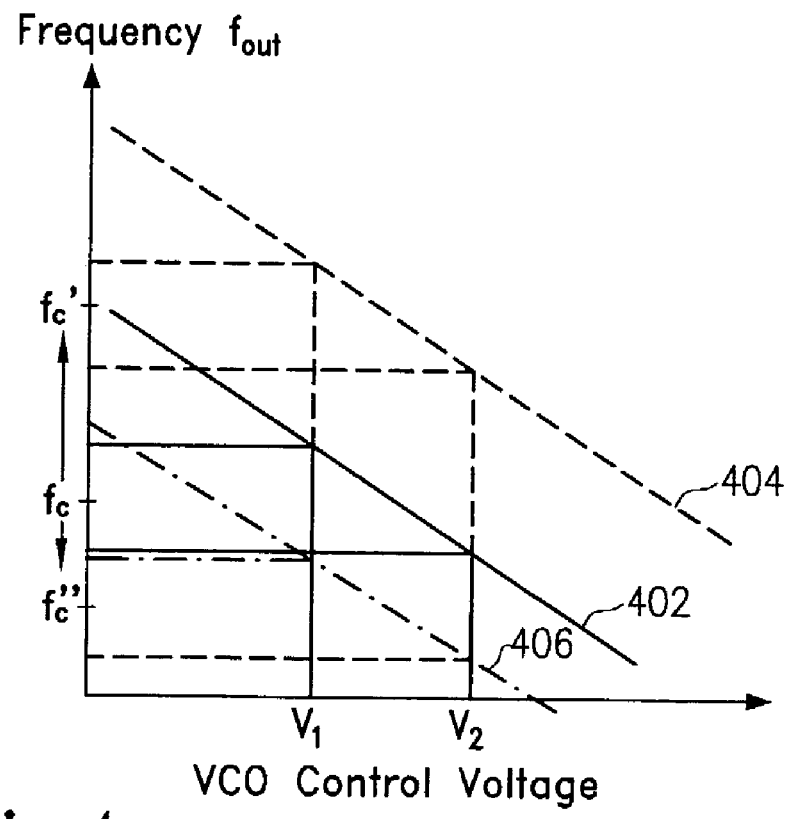
FIG. 4 is a diagram showing the output frequency as a function of the VCO control voltage.

As shown schematically in FIG. 4, the same steepness of the VCO frequency control characteristic 402, 404 and 406 can be maintained by tuning the center frequency $f_c$ to a higher or lower value for the same VCO control voltage range.

Figure 5:
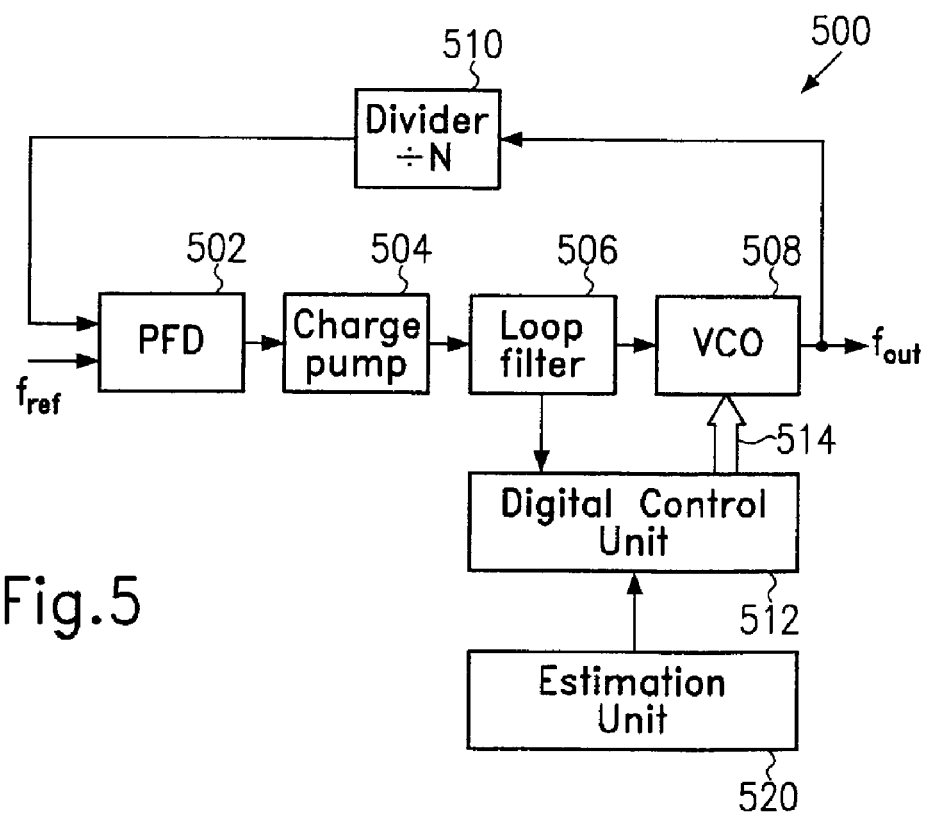
FIG. 5 is a block diagram of a frequency synthesizer according to a further preferred embodiment.
Figure 6:
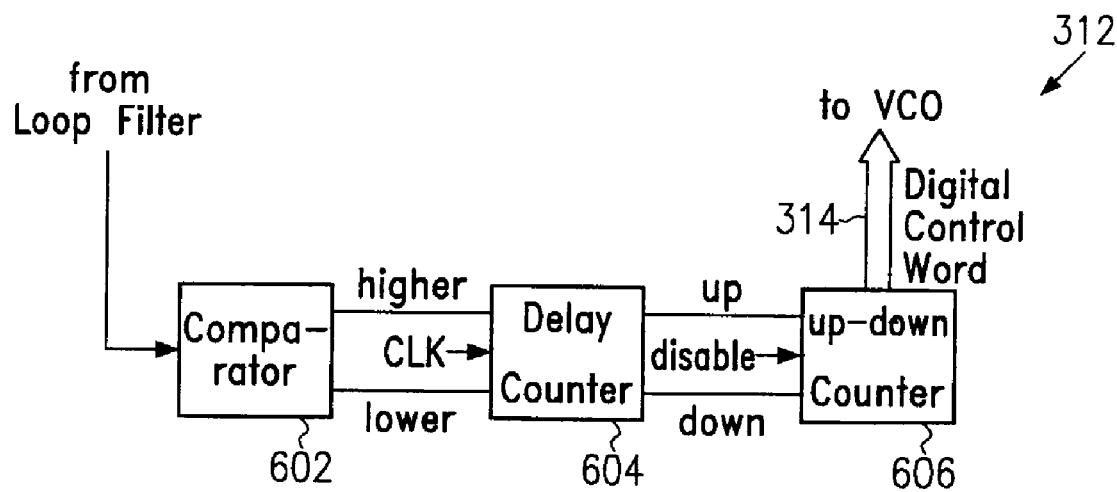
FIG. 6 is a block diagram of a digital control unit according to one embodiment.

According to another embodiment, which is depicted in FIG. 5, a PLL 500 may include an estimation unit 520. This estimation unit 520 may estimate a new center frequency value at channel switching. For instance, the center frequency can be set to an estimated value based on an actual one. This procedure may reduce the time required for channel switching at high frequency differences. Referring now to FIG. 6, one embodiment of a digital control unit 312 is shown. In order to select one of the different frequency ranges of the VCO, the digital control unit 312 generates a digital control word 314. A comparator 602 determines if the loop filter voltage input from the loop filter is below an upper limit or above a lower limit. If the loop filter voltage is out of range for a definite time depending on the loop filter frequency, an up/down counter 606 without overflow will be incremented for decremented. The up/down counter 606 is connected with the digital tuning inputs of VCO. Changes in the up/down counter 606 generate a reset to the delay counter 604, which controls the time between out of range and switching of the up/down counter 606. If the loop filter signal leaves the area out of range, the delay counter 604 also receives a reset.

Figure 7:
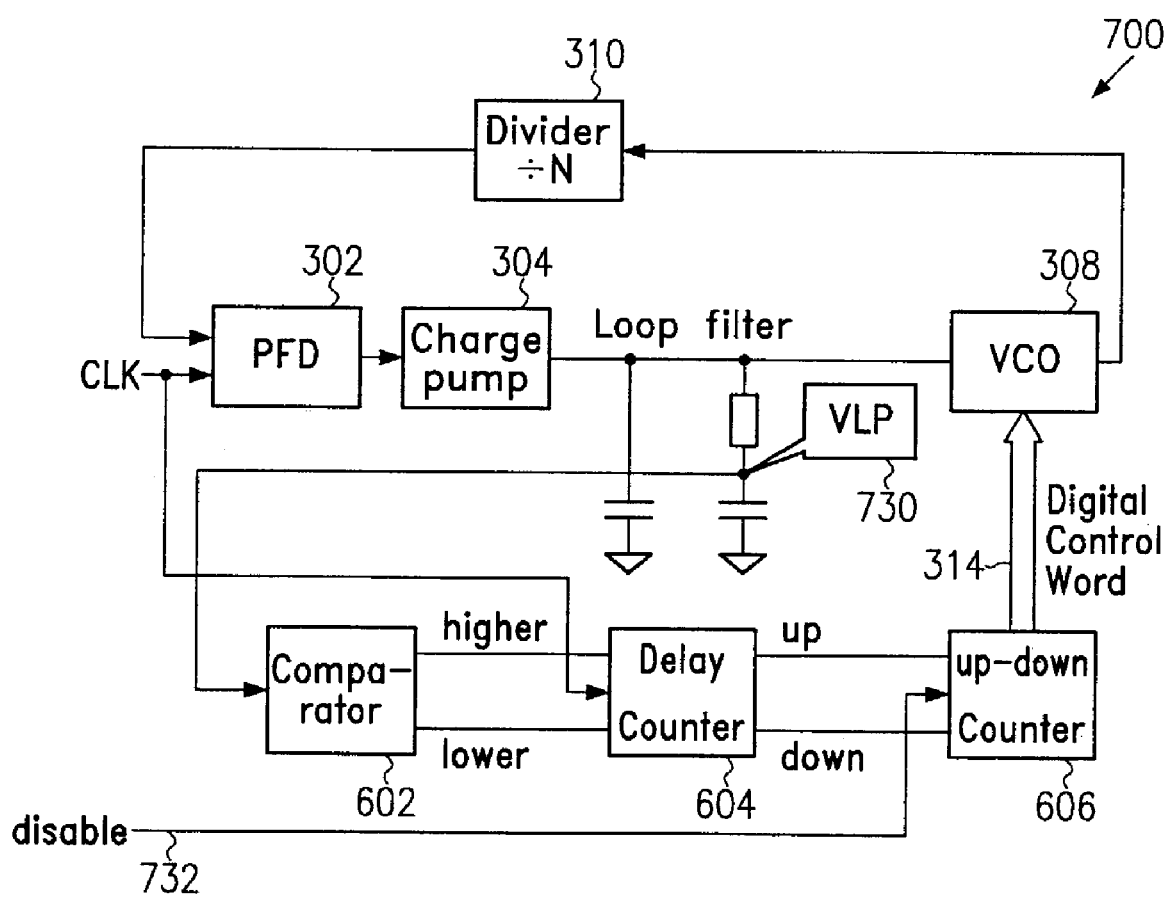
FIG. 7 is a block diagram of a frequency synthesizer according to still another embodiment.

According to another embodiment, which is shown in FIG. 7, the low pass filtered VCO tuning voltage (VLP) 730 is used as the loop filter signal and input into the comparator 602.

The tuning process, which selects one of the different frequency ranges of the VCO 308 is running not only at power up or at a particular tuning cycle, but is normally active. In case, a correct PLL function is needed, the tuning algorithm may be disabled by a disable signal 732.

While the invention has been described with respect to the physical embodiments in accordance therewith, it will be apparent to those skilled in the art that various modifications, variations and improvements of the present invention may be made in the light of the above teachings and within the purview of the appended claims without departing from the spirit and intended scope of the invention.

In addition, those areas in which it is believed that those ordinary skilled in the art are familiar have not been described herein in order not to unnecessarily obscure the invention described herein.

Accordingly, it is to be understood that the invention is not to be limited by the specific illustrated embodiments, but only by the scope of the appended claims.

What is claimed is:

1. A frequency synthesizer usable in a wireless communication device, the frequency synthesizer having a phase locked loop comprising:
   a controllable oscillator operable to generate an output signal having an output frequency, said controllable oscillator being arranged for adjusting said output frequency within a predefined frequency range dependent on the value of a first control signal;
   a phase/frequency detector operable to generate an error signal in response to a phase and/or frequency difference between an input signal generated by frequency dividing said output signal, and a reference signal;
   a loop filter connected to generate said first control signal based on said error signal and output the generated signal to said controllable oscillator; and
   a control unit connected to the loop filter to receive a loop filter signal and generate a second control signal therefrom, and further connected to said controllable oscillator to provide said second control signal to said controllable oscillator,
   wherein said controllable oscillator is arranged for modifying said predefined frequency range based on said second control signal, and
   wherein said control unit further comprises an estimation unit configured to estimate a center frequency value, wherein said control unit is adapted to generate, at channel switching, a new value for the second control signal in response to the estimated center frequency value.

2. The frequency synthesizer of claim 1, wherein said error signal is a charge-up or charge-down signal and wherein the frequency synthesizer further comprises a charge pump connected to receive said charge-up or charge-down signal and operable to generate a control voltage to be input into the loop filter.

3. The frequency synthesizer of claim 1, wherein said control unit further comprises at least one comparator connected to the loop filter for comparing said loop filter signal to at least one threshold value and operable to generate a comparator signal in response to a result of said comparison.

4. The frequency synthesizer of claim 3, wherein said control unit further comprises an up-down counter connected to receive said comparator signal which is incremented or decremented in response to said comparator signal to generate said second control signal.

5. The frequency synthesizer of claim 3, wherein said control unit further comprises a delay counter connected to receive said comparator signal and operable to update said second control signal only in case that said loop filter signal exceeds the at least one threshold value for a predefined time period.

6. The frequency synthesizer of claim 1, wherein said control unit further comprises a disable input terminal for inactivating said control unit in response to a disable signal.

7. The frequency synthesizer of claim 1, wherein said second control signal is a digital control word.

8. The frequency synthesizer of claim 1, wherein said second control signal specifies a center frequency of a respective frequency range.

9. The frequency synthesizer of claim 1, wherein said phase locked loop is an integer-N PLL circuit.

10. The frequency synthesizer of claim 1, wherein said controllable oscillator is a voltage controlled oscillator.

11. A method for operating a frequency synthesizer usable in a wireless communication device and having a phase locked loop with a controllable oscillator, said method comprising:
    determining a phase and/or frequency difference between an input signal generated by frequency dividing an output signal of said controllable oscillator, and a reference signal and generating a control signal for adjusting an output frequency of said controllable oscillator within a predefined frequency range dependent on the value of said control signal;
    determining whether said control signal exceeds at least one predetermined threshold;
    tuning said controllable oscillator to a different frequency range when said control signal exceeds or falls below said at least one predetermined threshold;
    and wherein the method further comprises:
    at channel switching, estimating a new center frequency and tuning said controllable oscillator in response to the estimated center frequency to a new frequency range.

12. The method of claim 11, wherein determining a phase and/or frequency difference between an input signal generated by frequency dividing an output signal of said controllable oscillator, and a reference signal comprises comparing a loop filter signal to at least one threshold value and generating a comparator signal in response to a result of said comparison.

13. The method of claim 11, said method further comprising incrementing or decrementing an up-down counter in response to said comparator signal to generate a second control signal for tuning said controllable oscillator to a different frequency range.

14. The method of claim 11, said method further comprising determining whether said control signal exceeds or falls below said at least one threshold for a predefined time period and wherein said controllable oscillator is tuned to a different frequency range only in case that said control signal exceeds or falls below said at least one threshold for a predefined time period.

15. The method of claim 13, wherein said second control signal is a digital control word.

16. The method of claim 13, wherein said second control signal specifies a center frequency of a respective frequency range.

17. The method of claim 11, wherein said phase locked loop is an integer-N PLL circuit.

18. The method of claim 11, wherein said controllable oscillator is a voltage controlled oscillator.

19. A WLAN (Wireless Local Area Network) receiver having a frequency synthesizer with a phase locked loop comprising:
    a controllable oscillator operable to generate an output signal having an output frequency, said controllable oscillator being arranged for adjusting said output frequency within a predefined frequency range dependent on the value of a first control signal;

a phase/frequency detector operable to generate an error signal in response to a phase and/or frequency difference between an input signal generated by frequency dividing said output signal, and a reference signal;

a loop filter connected to generate said first control signal based on said error signal and output the generated signal to said controllable oscillator; and a control unit connected to the loop filter to receive a loop filter signal and generate a second control signal there from, and further connected to said controllable oscillator to provide said second control signal to said controllable oscillator, wherein said controllable oscillator is arranged for modifying said predefined frequency range based on said second control signal, and wherein said control unit further comprises an estimation unit configured to estimate a center frequency value, wherein said control unit is adapted to generate, at channel switching, a new value for the second control signal in response to the estimated center frequency value.

20. A data communication device having a frequency synthesizer with a phase locked loop comprising:

a controllable oscillator operable to generate an output signal having an output frequency, said controllable oscillator being arranged for adjusting said output frequency within a predefined frequency range dependent on the value of a first control signal;

a phase/frequency detector operable to generate an error signal in response to a phase and/or frequency difference between an input signal generated by frequency dividing said output signal, and a reference signal;

a loop filter connected to generate said first control signal based on said error signal and output the generated signal to said controllable oscillator; and a control unit connected to the loop filter to receive a loop filter signal and generate a second control signal there from, and further connected to said controllable oscillator to provide said second control signal to said controllable oscillator, wherein said controllable oscillator is arranged for modifying said predefined frequency range based on said second control signal, and wherein said control unit further comprises an estimation unit configure to estimate a center frequency value, wherein said control unit is adapted to generate, at channel switching, a new value for the second control signal in response to the estimated center frequency value.

21. An integrated circuit chip having a phase locked loop circuit comprising:

a controllable oscillator unit operable to generate an output signal having an output frequency, said controllable oscillator unit being arranged for adjusting said output frequency within a predefined frequency range dependent on the value of a first control signal;

a phase/frequency detector unit operable to generate an error signal in response to a phase and/or frequency difference between an input signal generated by frequency dividing said output signal, and a reference signal;

a loop filter unit connected to generate said first control signal based on said error signal and output the generated signal to said controllable oscillator unit; and a control unit connected to the loop filter unit to receive a loop filter signal and generate a second control signal there from, and further connected to said controllable oscillator unit to provide said second control signal to said controllable oscillator unit, wherein said controllable oscillator unit is arranged for modifying said predefined frequency range based on said second control signal, and wherein said control unit further comprises an estimation unit configured to estimate a center frequency value, wherein said control unit is adapted to generate, at channel switching, a new value for the second control signal in response to the estimated center frequency value.

* * * * *